United States Patent
Cheng

[19]

[11] Patent Number: 6,081,425
[45] Date of Patent: Jun. 27, 2000

[54] MINIATURIZING POWER SUPPLY SYSTEM FOR PORTABLE COMPUTERS BY IMPROVING HEAT DISSIPATION THEREIN

[75] Inventor: Bruce C. H. Cheng, Taipei, Taiwan

[73] Assignee: Delta Electronics, Inc., Taipei, Taiwan

[21] Appl. No.: 09/223,832

[22] Filed: Jan. 2, 1999

Related U.S. Application Data

[60] Provisional application No. 60/070,338, Jan. 2, 1998.

[51] Int. Cl.[7] .................................................. H05K 7/20
[52] U.S. Cl. .......................... 361/704; 361/687; 361/690; 361/695; 361/697; 361/714; 361/724; 174/35 R; 165/122; 165/185
[58] Field of Search .................................... 361/683, 687, 361/601, 695, 704–707, 679, 720, 736, 748, 690, 814, 818, 801, 816, 691–697, 709–711, 714–718, 727, 724; 336/61; 174/35 GC, 35 R, 17 R, 17 VA, 16.3, 16.1; 220/4.02, 4.28; 248/632; 218/105, 106, 109; 307/150

[56] References Cited

U.S. PATENT DOCUMENTS

| | | | |
|---|---|---|---|
| 4,585,122 | 4/1986 | Stegenga | 206/334 |
| 5,258,888 | 11/1993 | Korinsky | 361/704 |
| 5,315,480 | 5/1994 | Samarov et al. | 361/705 |
| 5,773,755 | 6/1998 | Iwatare | 174/17 VA |
| 5,869,919 | 2/1999 | Sato et al. | 313/17 |

*Primary Examiner*—Leo P. Picard
*Assistant Examiner*—Michael Datskovsky
*Attorney, Agent, or Firm*—Bo-In Lin

[57] ABSTRACT

The present invention discloses a power supply for providing power from an external power source to a portable electronic device. The portable power supply system includes electronic circuits including an AC-to-DC converter for converting the power from the external power source for the portable electronic device. The portable power supply system further includes a printed circuit board for supporting the electronic circuits thereon. The portable power supply system further includes an inner enclosure for enclosing and protecting the electronic circuits supported on the printed circuit board wherein the inner enclosure composed of heat conductive materials. The portable power supply system further includes an external container for containing and protecting the portable power supply system wherein the external container further includes a plurality of air vents for allowing heat dissipation therefrom.

20 Claims, 5 Drawing Sheets

MINIATURIZING POWER SUPPLY SYSTEM FOR PORTABLE COMPUTERS BY IMPROVING HEAT DISSIPATION THEREIN

This Application claimed a priority filing date of Jan. 2, 1998 benefited from a Provisional Application 60/070,338 filed on Jan. 2, 1998 by the same inventor of this Formal Application.

BACKGROUND OF THE INVENTION

1. Field of the Invention

This invention relates generally to a power supply system for a portable computer. More particularly, this invention relates to a new design approach for a power supply system of a portable electronic device. The portable device may be a portable computer. The purpose is to improve the cooling of the electronic circuits and to enhance the heat dissipation in order to further miniaturize the power supply system thus improving the portability by reducing the weight, size and packaging dimensions thereof.

2. Description of the Prior Art

The portability of a notebook computer or a portable electronic device is often adversely affected by the requirement that such devices are commonly accompanied by a portable power supply system to function as an AC-to-DC adaptor for connecting to an AC power source. The weight and size of this companion power supply system adds to the burden and inconvenience in operating the portable devices. Further miniaturization of the power supply system is limited by the design considerations that certain space for heat conduction is required to prevent overheating and damage to the electronic circuits contained in a portable power supply box.

One solution to this limitation is to build the power supply system in the portable devices to include the function for converting an AC input current to a DC output current for operating the devices. However, this built-in configuration imposes additional weight and size to the portable device with the AC-to-DC converter incorporated as permanent built-in parts. The flexibility of a user not to carry such a power supply system is deprived when an AC power source is either not available or not required for a user to use the notebook computer or a electronic device in a portable mode.

A conventional portable power supply system, which includes an AC-to-DC converter for accompanying a notebook computer or a portable electronic device, is shown in FIG. 1. Such a system is most commonly provided electronic circuits supported on a printed circuit board and contained in a plastic case. The plastic case has to be manufactured with insulation materials provided certain structural integrity to with mechanical strength to sustain various physical impacts to the plastic case. Because the plastic case is employed to contain and protect the electronic circuits. The power supply system including the AC-to-DC conversion circuits must be provided to operate with long term reliability under various conditions that various environmental hazards can be imposed on the system resulted from daily use. More importantly, the case has to provide a seal space for containing the electronic circuits such that moistures or particles from the air are prevented from entering into the sealed space containing the power supply circuits. As good insulation and protection are provided by the plastic containing case, the configuration of this conventional power supply system, however, created a sealed space surrounding the power supply electronic circuits where the dissipation rate of heat generated the circuits are significantly reduced.

FIG. 1 shows a prior art portable power supply system 10 which includes a fully enclosed case 15 for containing and protecting a plurality of electronic circuits 20 generally supported on a printed circuit board (PCB) 25. The fully enclosed case 15 prevents foreign contaminants and moistures from entering into the sealed space thus protecting the electronic circuits 20. However, as the fully enclosed plastic case 15 block the air flow between the sealed space and the external environment, the process for heat dissipation by convection is no longer available. The heat generated from the electronic circuits 20 inside the sealed space can only be conducted through the surface of the plastic case 15. As the plastic case 15 is not an effective heat conductive material, in order to maintain certain heat conduction through the plastic case, the size of the plastic case must be kept at certain size to assure sufficient heat dissipation is maintained. The size limitation due to the constraints imposed by heat conduction thus hinders the power supply system 10 from size reduction and the goal of further miniaturization can not be achieved due to this bottleneck.

Therefore, a need still exists for a new system configuration and design method in the art of portable power-supply packaging and manufacture in order to resolve these difficulties and limitations. More particularly, this new system configuration and design approach must be able to provide more effective heat dissipation paths to allow effective conduction or convection of the heat generated by the electronic circuits in the power supply system. By providing this new system configuration with more effective heat dissipation would then enable those of ordinary skill in the art to further reduce the size and weight of the portable power supply systems such that the difficulties and limitations encountered in the prior art may be resolved.

SUMMARY OF THE PRESENT INVENTION

It is therefore an object of the present invention to provide a portable power supply system with novel design method and packaging configuration to enhance the heat dissipation of the power supply system to overcome the aforementioned difficulties encountered in the prior art.

Specifically, it is an object of the present invention to provide a portable power supply system with a heat conductive enclosure inside of a vented plastic case. The power supply system allows for more effective heat conduction and convention for transferring and removing the heat generated from the electronic circuits of the portable power supply system. The portable power supply system may be reduced in size and weight without being limited by the constraints of maintaining the conductive areas for dissipating heat therefrom.

Another object of the present invention is to provide a portable power supply system wherein a heat conductive inner enclosure is provided which is then contained in a vented case. The heat generated inside the inner enclosure can be effectively conducted through the inner enclosure and heat removal can also be carried out through a convection path via the vented case. Higher rate of heat dissipation can be achieved. By overcoming the limitations due to the heat transfer constraints, the portable power supply can be further miniaturized.

Another object of the present invention is to provide a portable power supply system wherein a heat conductive inner enclosure is provided which is then contained in a vented plastic case. The inner heat-conductive enclosure can also be employed for providing protection against the electric-magnetic interference whereby a portable power supply system of improved performance can be provided.

Another object of the present invention is to provide a portable power supply system wherein a heat conductive inner enclosure is provided which is then contained in a vented plastic case. A miniaturized cooling fan can also be employed to increase the rate of heat removal of whereby the power supply system can be manufactured with smaller size by packing the electronic circuit into smaller space without being limited by the concerns of damages caused by circuit overheating.

Another object of the present invention is to provide a portable power supply system wherein a heat conductive inner enclosure is provided which is then contained in a vented plastic case. The electronic circuits can be sealed with a conductive coating whereby the plastic vented plastic container for containing the coated electronic circuits can be manufactured with more flexible shapes to provide better space utility depending on the shapes, size and applications of the portable electronic devices.

Briefly, in a preferred embodiment, the present invention discloses a portable power supply system for providing power from an external power source to a portable electronic device. The portable power supply system includes electronic circuits including an AC-to-DC converter for converting the power from the external power source for the portable electronic device. The portable power supply system further includes a printed circuit board for supporting the electronic circuits thereon. The portable power supply system further includes an inner enclosure for enclosing and protecting the electronic circuits supported on the printed circuit board wherein the inner enclosure composed of heat conductive materials. The portable power supply system further includes an external container for containing and protecting the portable power supply system wherein the external container further includes a plurality of air vents for allowing heat dissipation therefrom.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
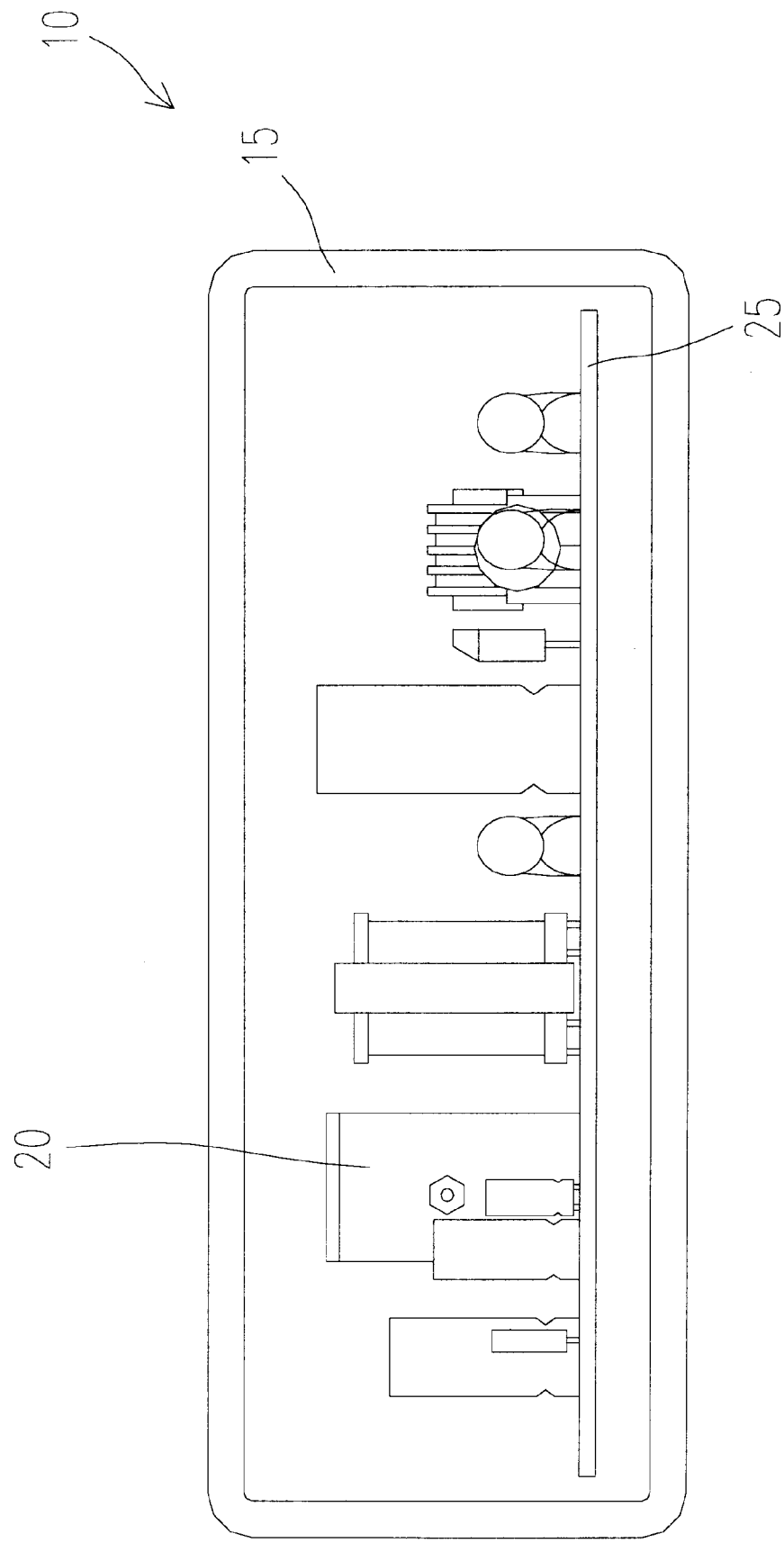
FIG. 1 is a partial perspective view of a portable power supply system commonly employed in the prior art for portable electronic devices.
Figure 2:
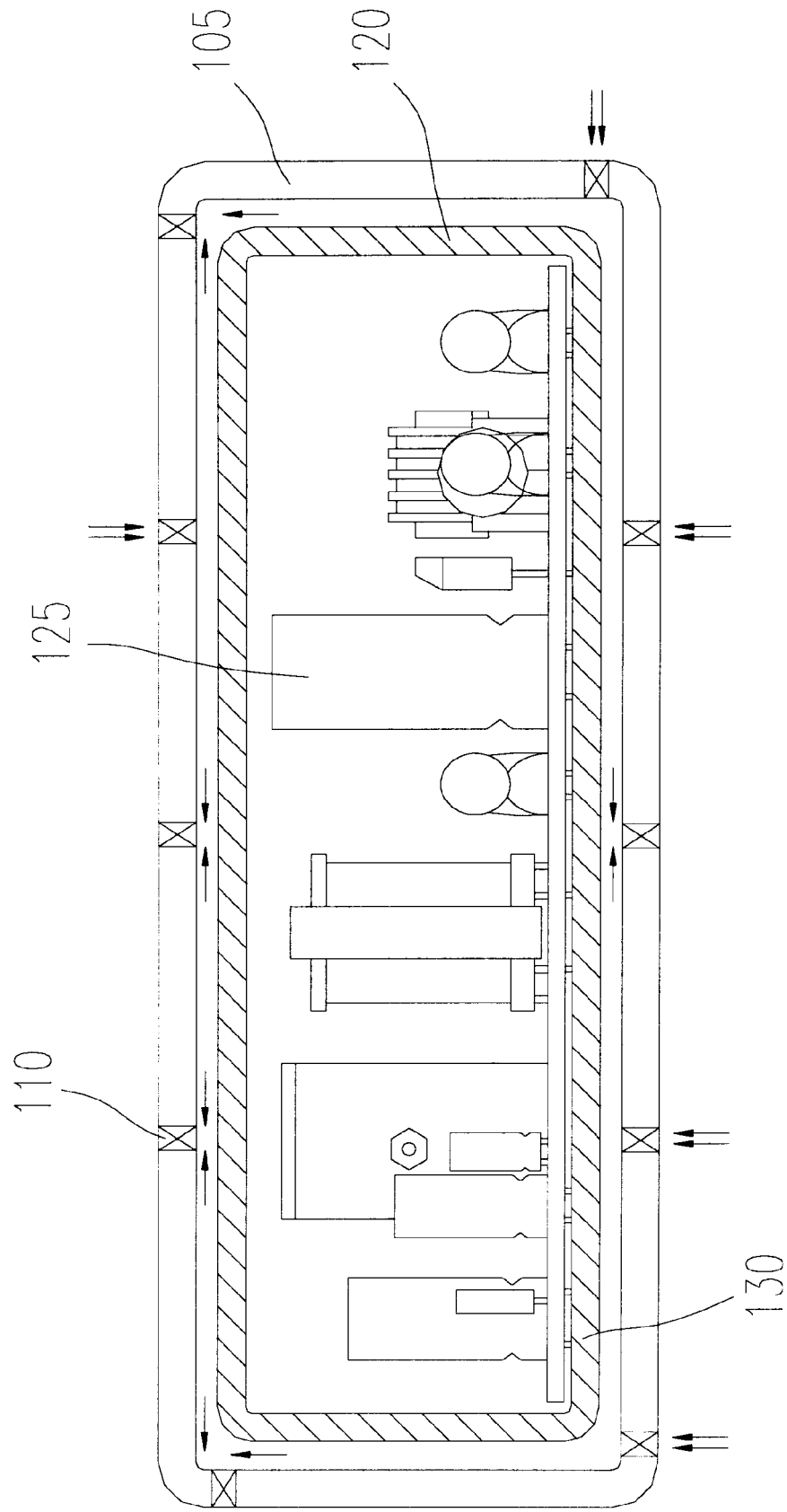
FIG. 2 is a side view of a portable power supply system showing the conductive inner enclosure of the present invention for insulating and protecting the electronic circuits.

Referring to FIG. 2 for a side view of a portable power supply system 100 of the present invention. The portable power supply system 100 is contained in an external container 105 which is a plastic box wherein a plurality of air vents are opened to allow air flow to pass through thus providing a energy removal path by a heat convection process. Inside the container 105 is an inner enclosure 120, which may preferably be a metal case, e.g., a copper or aluminum case. The inner enclosure 120 encloses and protects the electronic circuits 125 supported on a printed circuit board 130. The electronic circuits 125 typically include circuits for AC-to-DC conversion for providing power to a portable electronic device (not shown) such as a notebook computer. The inner enclosure 120 in this invention is composed of heat conductive materials including a metal case. The heat generated from the electronic circuits 125 supported on the PCB 130 are dissipated by a heat conduction process through the conductive inner enclosure 120. Opening a plurality of air vents 110 on the external container 105 further enhances the heat dissipation rate. The air vents allow the air flow to pass through thus provides an energy removal path through a heat convection process. The heat now conducted to the outer surface of the inner enclosure 120 can be further transferred by a heat convection process through the airflow to be released into the external environment. The heat transfer process is therefore significantly improved with the novel package configuration.

Figure 3:
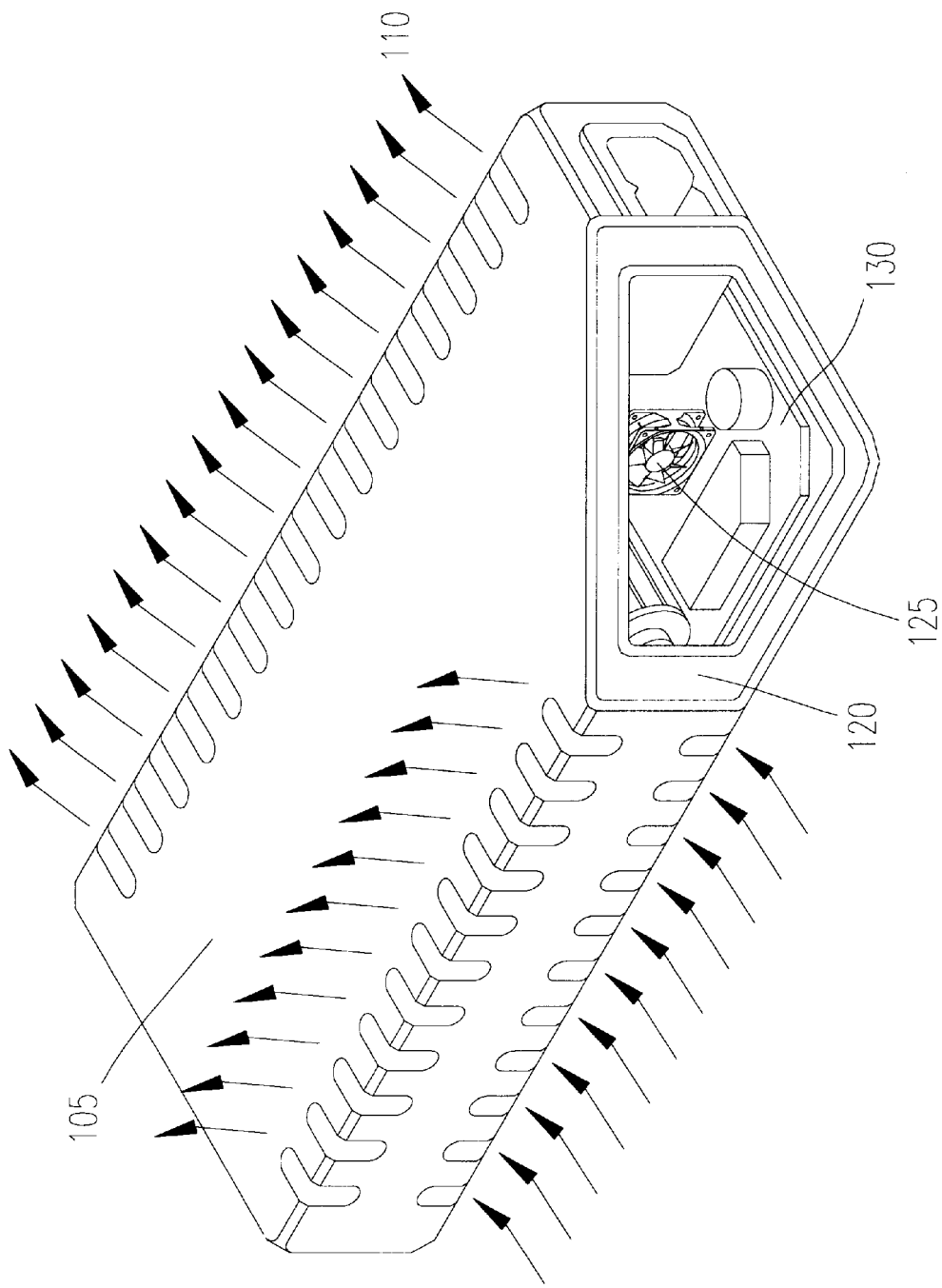
FIG. 3 is a perspective view showing a plastic case which includes a plurality of air vents to enhance the heat dissipation by allowing heat transfer through heat convection with air flow through the air vents.

The portable power supply system 100 as shown in FIG. 2 provides a further advantage that the metallic inner enclosure 120 further function as a shield to protect the electronic circuits 125 from electrical magnetic interference (EMI). Therefore, the performance characteristics of the portable power supply system is further improved because the portable power supply system is now operated at a lower temperature with improved heat transfer configuration and additionally interference from EMI is also shielded. FIG. 3 is a perspective view of such packaging configuration with the inner metallic case 120 provides dual functions of heat conducting media and electrical magnetic interference shield.

Figure 4:
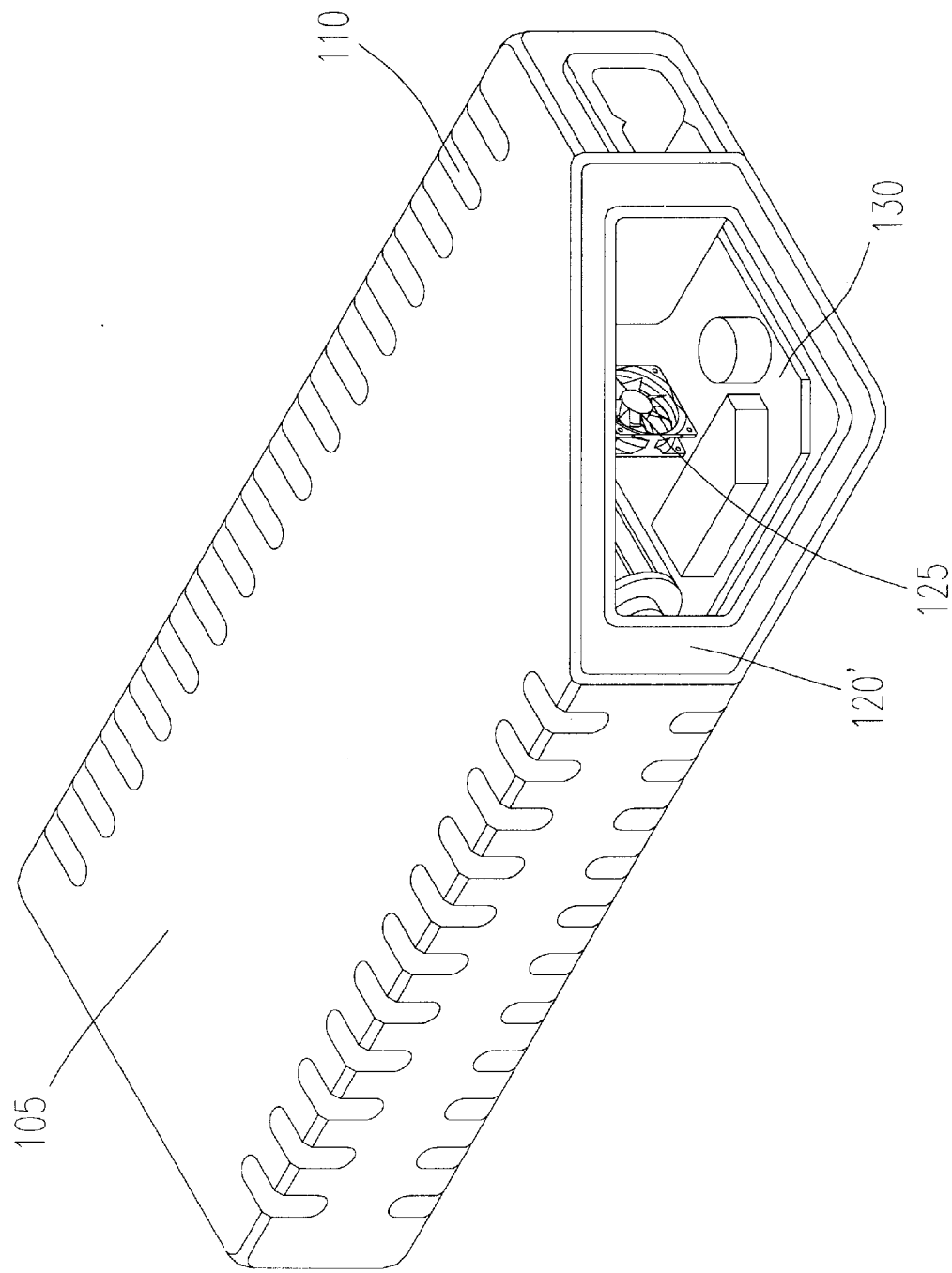
FIG. 4 is a partial perspective view of a portable power supply system according to the present invention wherein the a heat-conducting overall coating is applied over the circuits supported on the PCB.

Referring to FIG. 4 for an alternate preferred embodiment for the portable power supply system 100' of the present invention. Instead of using an inner metallic case 120 as that shown in FIG. 3, a heat conductive coating 120' is employed. The heat conductive coating 120' can be a flexible coating composed of materials with high heat conductivity coefficients. The conductive coating provides several advantages that the heat removal is more effective because there can be more space allow for the air to flow between the gaps between the coating 120' and the external container 105. Additionally, since the conductive coating can be formed in closer contact with the electronic circuits 125, heat conduction to the conductive coating is also more effective carried out through intimate physical contact. The thickness and the material compositions of the coating layer 120 can be flexibly selected to optimize the heat transfer characteristics for the specific application of the portable power supply system 100'. An EMI protective coating can also be formed over the heat conductive coating as required for providing the protection of the electronic circuits against potential EMI damages.

Figure 5:
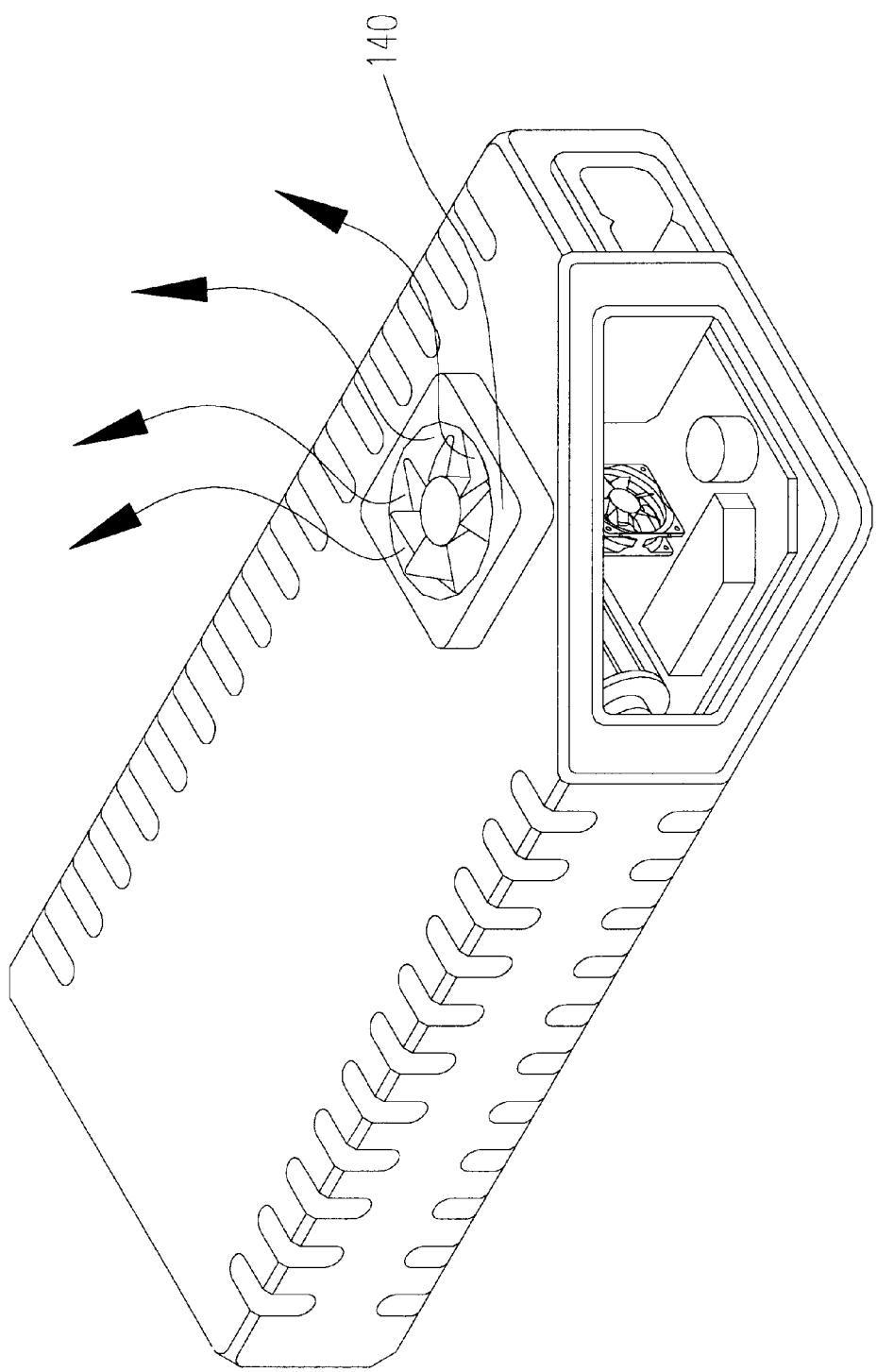
FIG. 5 is partial perspective views of a portable power supply system where a miniaturized cooling fan is installed on the plastic case provided with air vents to further increase the rate of heat dissipation.

Referring to FIG. 5 for yet another preferred embodiment of a portable power supply system 100" of the present invention. In order to further increase the rate of heat dissipation, a cooling fan 140 is installed on the external container 105. The heat transfer is further increase by the convection process with air flow passing through the air vents 110 when the cooling fan 140 asserting a forced air flow through the air vent 110. The energy generated from the electronic circuits 125 is first conducted to the surface of the inner enclosure 120. The energy transferred to the inner enclosure 120 is further carried away to the atmosphere outside of the external container by a heat convection process through the air vents 110 because the forced air now generated by the cooling fan 140.

The dimension of a portable power supply system 100 of the present invention can be further miniaturized because of the improved heat dissipation. For a typical portable power supply system employed for a notebook computer, the size of the power supply can be easily reduced to about eighty percent to about half of the size as currently achievable. By providing higher rate of heat dissipation to the power supply system, smaller and lighter power supply systems for the portable electronic devices can then be manufactured.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A portable power supply system for providing power from an external power source to a portable electronic device comprising:

electronic circuits including an AC-to-DC converter for converting said power from said external power source for said portable electronic device;

a printed circuit board for supporting said electronic circuits thereon;

an inner enclosure for enclosing and protecting said electronic circuits supported on said printed circuit board wherein said inner enclosure composed of heat conductive materials;

an external container for containing and protecting said portable power supply system wherein said external container further includes a plurality of opened air vents; and an air space between said external container and said inner enclosure for insulating said inner enclosure from said external container and for heat convection through said air space and said plurality of opened air vents.

2. The portable power supply system of claim 1 wherein:
said inner heat conductive enclosure comprising a metal enclosure enclosing and protecting said electronic circuits supported on said printed circuit board and for conducting heat from said printed circuit board to said air space for heat convention through said air space and said plurality of opened air vents.

3. The portable power supply system of claim 2 wherein:
said metal enclosure comprising a copper inner case for enclosing and protecting said electronic circuits supported on said printed circuit board while providing heat conductivity therefrom to said air space for heat convention through said air space and said plurality of opened air vents.

4. The portable power supply system of claim 2 wherein:
said metal enclosure comprising an aluminum inner case for enclosing and protecting said electronic circuits supported on said printed circuit board while providing heat conductivity therefrom to said air space for heat convention through said air space and said plurality of opened air vents.

5. The portable power supply system of claim 2 wherein:
said metal enclosure comprising a heat-conductive metallic-alloy inner case for enclosing and protecting said electronic circuits supported on said printed circuit board while providing heat conductivity therefrom to said air space for heat convention through said air space and said plurality of opened air vents.

6. The portable power supply system of claim wherein:
said inner heat conductive enclosure comprising a heat conductive coating overlaying said printed circuit board for enclosing and protecting said electronic circuits supported on said printed circuit board and for conducting heat from said printed circuit board to said air space for heat convention through said air space and said plurality of opened air vents.

7. The portable power supply system of claim 6 wherein:
said heat conductive coating comprising a thin film coating for enclosing and protecting said electronic circuits supported on said printed circuit board while providing heat conductivity therefrom to said air space for heat convention through said air space and said plurality of opened air vents.

8. The portable power supply system of claim 1 wherein:
said plurality of opened air vents disposed on said external container comprising opened air vents of elongated through-holes opened in said external container of size ranging from 0.3 to 2.5 centimeters in length and 0.5 to 1.4 centimeters in width.

9. The portable power supply system of claim 1 wherein:
said external container for containing and protecting said portable power supply system further includes a miniaturized cooling fan for increasing heat dissipation through an air flow in said air space flowing out from said plurality of opened air vents disposed thereon.

10. A portable power supply system for providing power from an external power source to a portable electronic device comprising:

electronic circuits including an AC-to-DC converter for converting said power from said external power source for said portable electronic device;

a printed circuit board for supporting said electronic circuits thereon;

a metallic inner case for enclosing and protecting said electronic circuits supported on said printed circuit board wherein said metallic inner enclosure composed of heat conductive metallic materials;

an external container for containing and protecting said portable power supply system wherein said external container further includes a plurality of opened air vents;

an air space between said external container and said inner enclosure for insulating said inner enclosure from said external container and for heat convection through said air space and said plurality of opened air vents; and said external container further includes a miniaturized cooling fan for increasing heat dissipation through an air flow in said air space flowing out from said plurality of opened air vents disposed thereon.

11. A portable power supply system for providing power from an external power source to a portable electronic device comprising:

electronic circuits including an AC-to-DC converter for converting said power from said external power source for said portable electronic device;

a printed circuit board for supporting said electronic circuits thereon;

a heat conductive coating overlaying said printed circuit board for enclosing and protecting said electronic circuits supported on said printed circuit board wherein said heat conductive coating composed of electrical insulation materials;

an external container for containing and protecting said portable power supply system wherein said external container further includes a plurality of opened air vents;

an air space between said external container and said inner enclosure for insulating said inner enclosure from said external container and for heat convection through said air space and said plurality of air vents; and said external container further includes a miniaturized cooling fan for increasing heat dissipation through an air flow in said air space flowing out from said plurality of opened air vents disposed thereon.

12. A portable power supply system for including AC-to-DC conversion electronic circuits contained in an external container comprising:

an inner enclosure for enclosing and protecting said electronic circuits wherein said inner enclosure composed of heat conductive materials;

a printed circuit board for supporting said electronic circuits thereon; and an external container for containing and protecting said portable power supply system wherein said external container further includes a plurality of opened air vents; and an air space between said external container and said inner enclosure for insulating said inner enclosure from said external container and for heat convection through said air space and said plurality of opened air vents.

13. The portable power supply system of claim 12 wherein:

said inner heat conductive enclosure includes a metal enclosure enclosing and protecting said electronic circuits supported on said printed circuit board and for conducting heat from said printed circuit board to said air space for heat convention through said air space and said plurality of opened air vents.

14. The portable power supply system of claim 13 wherein:

said metal enclosure comprising a copper inner case for enclosing and protecting said electronic circuits supported on said printed circuit board while providing heat conductivity therefrom to said air space for heat convention through said air space and said plurality of opened air vents.

15. The portable power supply system of claim 13 wherein:

said metal enclosure comprising an aluminum inner case for enclosing and protecting said electronic circuits supported on said printed circuit board while providing heat conductivity therefrom to said air space for heat convention through said air space and said plurality of opened air vents.

16. The portable power supply system of claim 13 wherein:

said metal enclosure comprising a heat-conductive metallic-alloy inner case for enclosing and protecting said electronic circuits supported on said printed circuit board while providing heat conductivity therefrom to said air space for heat convention through said air space and said plurality of opened air vents.

17. The portable power supply system of claim 12 wherein:

said inner heat conductive enclosure comprising a heat conductive coating overlaying said printed circuit board for enclosing and protecting said electronic circuits supported on said printed circuit board and for conducting heat from said printed circuit board to said air space for heat convention through said air space and said plurality of opened air vents.

18. The portable power supply system of claim 17 wherein:

said heat conductive coating comprising a thin film coating for enclosing and protecting said electronic circuits supported on said printed circuit board while providing heat conductivity therefrom to said air space for heat convention through said air space and said plurality of opened air vents.

19. The portable power supply system of claim 12 wherein:

said plurality of opened air vents disposed on said external container comprising air vents of elongated through-holes opened in said external container of size ranging from 0.3 to 2.5 centimeters in length and 0.5 to 1.4 centimeters in width.

20. The portable power supply system of claim 12 wherein:

said external container for containing and protecting said portable power supply system further includes a miniaturized cooling fan for increasing heat dissipation through an air flow in said air space flowing out from said plurality of opened air vents disposed thereon.

* * * * *